US 7,004,764 B2

(12) United States Patent
Boudreau et al.

(10) Patent No.: US 7,004,764 B2
(45) Date of Patent: Feb. 28, 2006

(54) CIRCUIT BOARD RETAINER

(75) Inventors: Maida Boudreau, Brimfield, MA (US);
Gerald J. Cote, Westborough, MA (US); W. Brian Cunningham, Westborough, MA (US); C. Ilhan Gundogan, Lexington, MA (US)

(73) Assignee: EMC Corporation, Hopkinton, MA (US)

( * ) Notice: Subject to any disclaimer, the term of this patent is extended or adjusted under 35 U.S.C. 154(b) by 0 days.

(21) Appl. No.: 10/877,244

(22) Filed: Jun. 25, 2004

(65) Prior Publication Data
US 2005/0287838 A1  Dec. 29, 2005

(51) Int. Cl.
*H01R 12/00* (2006.01)

(52) U.S. Cl. ............. 439/74; 174/138 G; 361/758

(58) Field of Classification Search ........... 439/327, 439/74, 758–759; 174/138 G; 361/758–760
See application file for complete search history.

(56) References Cited

U.S. PATENT DOCUMENTS 5,223,674 A * 6/1993 Reznikov ............... 174/138 D
5,268,820 A * 12/1993 Tseng et al. ............ 361/785
6,109,930 A * 8/2000 Koschmeder et al. ...... 439/74
6,603,664 B1 * 8/2003 Gallarelli et al. .......... 361/747
6,603,669 B1 * 8/2003 Sheen et al. ............. 361/801
6,621,002 B1 * 9/2003 Ennis et al. ............ 174/35 GC
6,801,434 B1 * 10/2004 Gallarelli et al. .......... 361/747
6,813,165 B1 * 11/2004 Cheng et al. ............. 361/801
2005/0117313 A1 * 6/2005 Wang ..................... 361/753

* cited by examiner

Primary Examiner—Michael C. Zarroli
(74) Attorney, Agent, or Firm—Guerin & Rodriguez, LLP; Michael A. Rodriguez

(57) ABSTRACT

Described is a retainer having a base for attaching to a first circuit board. Opposing spatially separated first and second support members extend from one side of the base. The first support member has a latch portion and a terrace for supporting a portion of a second circuit board thereon. An arm has a free first end with a projection extending therefrom and a second end pivotally attached to the second support member for rotational movement between an open position and a closed position. An intermediate section of the arm latches onto the latch portion when the arm is rotated into the closed position. The free first end of the arm extends beyond the first support member for pressing the projection against a surface of the second circuit board when the intermediate section of the arm is latched onto the latch portion.

19 Claims, 5 Drawing Sheets

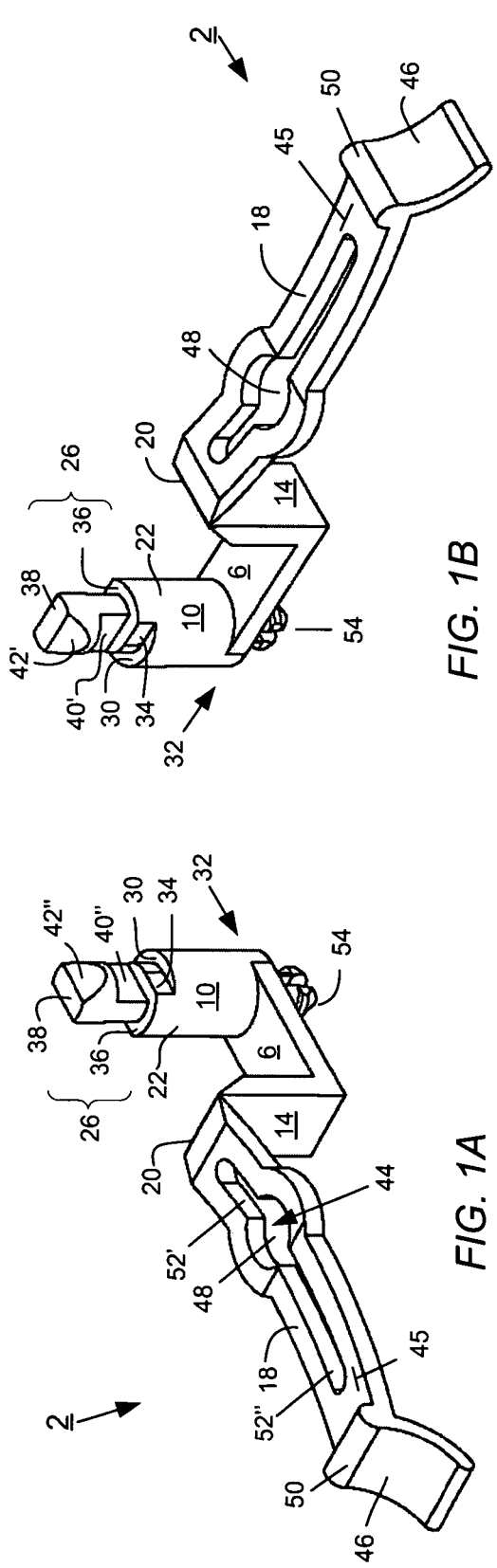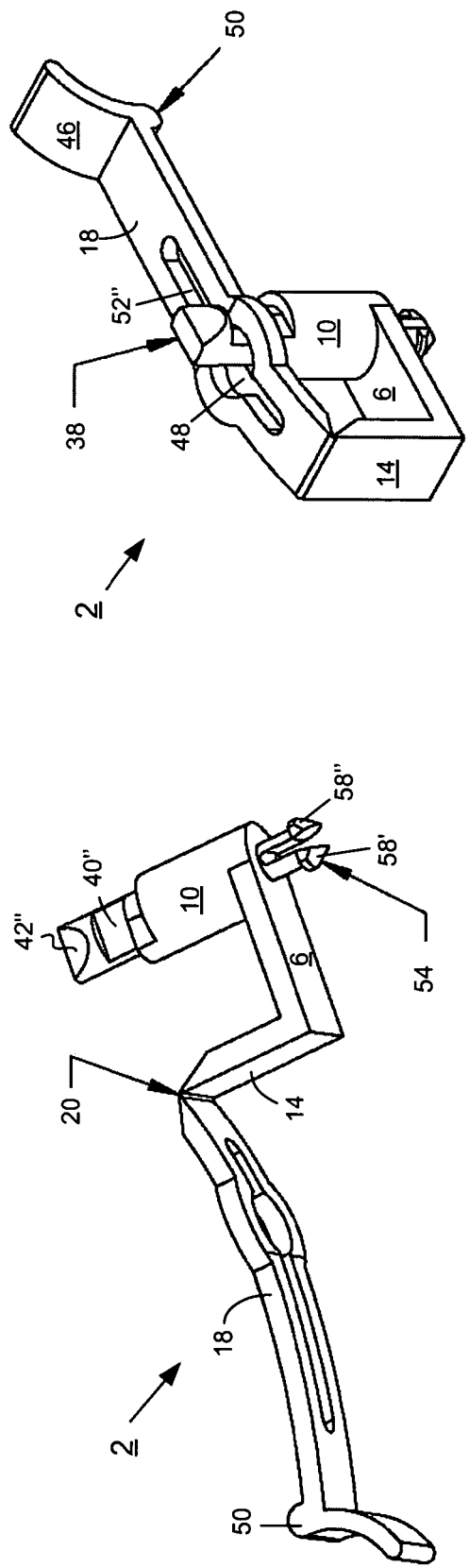

CIRCUIT BOARD RETAINER

FIELD OF THE INVENTION

The invention relates generally to electronics systems. More particularly, the invention relates to a retainer for maintaining connectivity between mated electrical connectors on adjacent circuit boards.

BACKGROUND

Electronics systems typically have multiple circuit boards. Often, electronic components on one circuit board need to communicate electrically with electronic components on another circuit board. One technique for enabling the exchange of electrical signals between circuit boards is to arrange for the circuit boards to be adjacent and parallel to each other and to use electrical connectors mounted on opposing surfaces of the circuit boards to join them. Electronic components on the circuit boards can then exchange electrical communications through the mated electrical connectors. A problem encountered with adjacent circuit boards joined in this fashion, however, is that vibrations of the circuit boards or of the electronics system can, over time, cause the mated electrical connectors to loosen and separate and thus become electrically disconnected. Thus, there is a need for a mechanism that can ensure that the mated electrical connectors remain electrically connected.

SUMMARY

In one aspect, the invention features a circuit board retainer having a base for attaching to a first circuit board and opposing spatially separated first and second support members extending from one side of the base. The first support member has a latch portion and a terrace adjacent to the latch portion for supporting a portion of a second circuit board thereon. The retainer also has an arm having a free first end with a projection extending from a surface thereof and a second end pivotally attached to an edge of the second support member for rotational movement between an open position and a closed position. A section of the arm between the first free end and the second end latches onto the latch portion of the first support member when the arm is rotated into the closed position. The free first end of the arm extends beyond the first support member for pressing the projection against a surface of the second circuit board when the section of the arm between the first free end and the second end is latched onto the latch portion of the first support member.

In another aspect, the invention features an electronics module with a first circuit board having a surface with an electrical connector attached thereto, a second circuit board having a surface with an electrical connector attached thereto and mated to the electrical connector of the first circuit board, and a retainer having a base attached to the first circuit board, opposing spatially separated first and second support members extending from one side of the base, and an arm having a free first end and a second end pivotally attached to an edge of the second support member for rotational movement between an open position and a closed position. The first support member has a latch portion and a terrace for setting a portion of the second circuit board thereon. An intermediate section of the arm latches onto the latch portion of the first support member when the arm is rotated into the closed position. The free first end of the arm extends beyond the first support member and presses against an opposite surface of the second circuit board to urge the mated electrical connectors together when the arm is latched to the first support member.

In yet another aspect, the invention features a circuit board retainer for maintaining an electrical connector on a first circuit board in a mated condition with an electrical connector on a second circuit board. The retainer includes means for securing the retainer to the first circuit board. The securing means has a base. The retainer also includes means, connected to the base, for supporting a portion of a second circuit board adjacent and substantially parallel to the first circuit board such that the electrical connectors can make an electrical connection with each other, and means for urging the second circuit board toward the first circuit board to maintain the electrical connection between the electrical connectors.

BRIEF DESCRIPTION OF THE DRAWINGS

The above and further advantages of this invention may be better understood by referring to the following description in conjunction with the accompanying drawings, in which like numerals indicate like structural elements and features in various figures. The drawings are not necessarily to scale, emphasis instead being placed upon illustrating the principles of the invention.

FIG. 1A is a first isometric view of an embodiment of a circuit board retainer of the present invention in an open position.

FIG. 1B is a second isometric view from another side of the circuit board retainer of FIG. 1A.

FIG. 1C is view showing an underside of the circuit board retainer of FIG. 1A.

FIG. 1D is an isometric view of the circuit board retainer of the present invention in a closed position.

DETAILED DESCRIPTION

The invention features a retainer for maintaining an electrical connection between mated electrical connectors mounted on adjacent circuit boards in an electronics system. The retainer can be used in a variety of electronics systems, such as data storage systems, computer systems, and electronic devices (e.g., desktop, handheld). Attached to a surface of a first circuit board, the retainer holds a second circuit board adjacent and parallel to the first circuit board so that the electrical connectors can be mated. A rotatable arm of the retainer, indirectly anchored at one end to the first circuit board, folds over onto the second circuit board and latches onto a support member of the retainer. When in this latched or closed position, the arm exerts pressure against the surface of the second circuit board that urges the circuit boards together and thus maintains the connection between the mated electrical connectors.

Figure 1E:
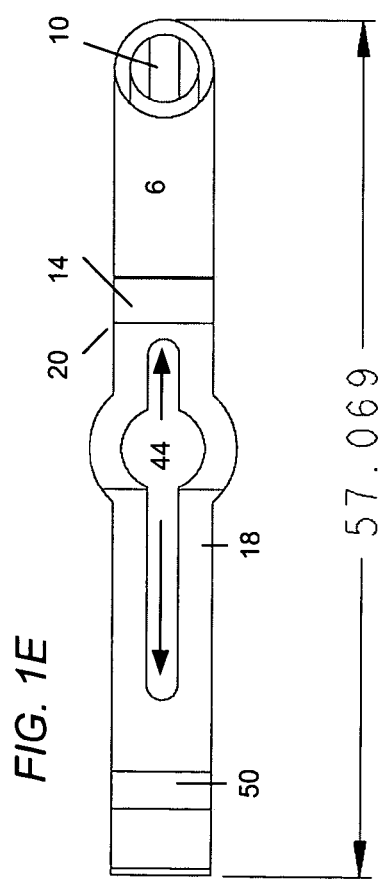
FIG. 1E is a top view of the circuit board retainer of the present invention in an open position.
Figure 1F:
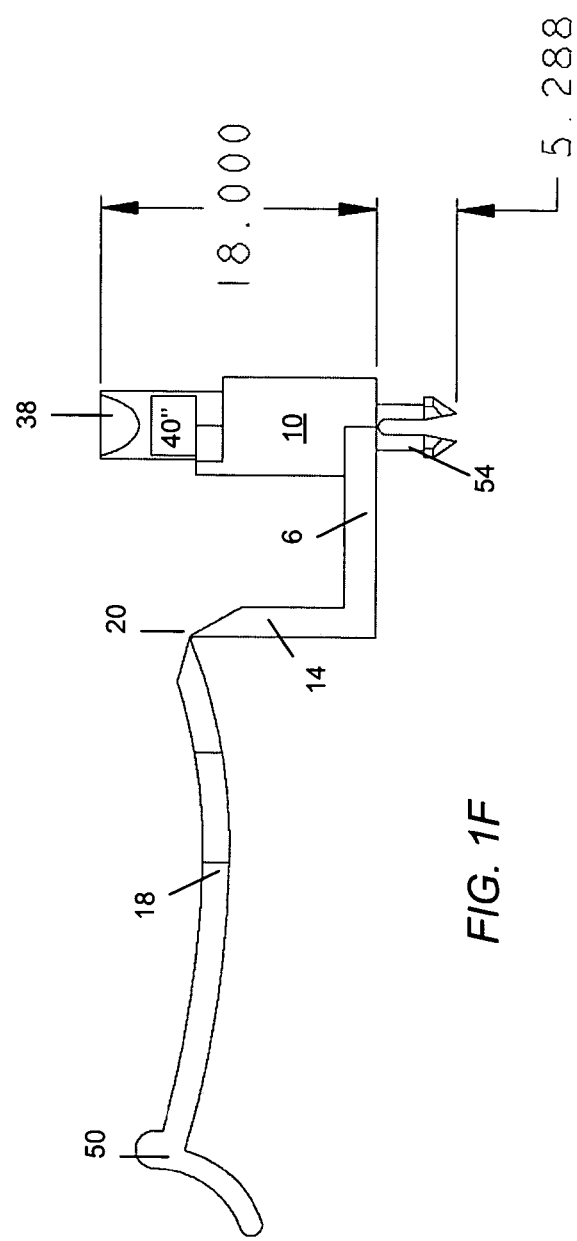
FIG. 1F is a side view of the circuit board retainer in the open position.

Referring to FIGS. 1A–1F, shown are different views of an embodiment of a circuit board retainer 2 of the invention. FIG. 1A and FIG. 1B show the retainer 2 in an open position from opposite sides; FIG. 1C shows an underside of the retainer 2, also in the open position; FIG. 1D shows the retainer 2 in a closed position; and FIG. 1E and FIG. 1F show a top view and a side view, respectively, of the retainer 2 and exemplary dimensions for one retainer embodiment.

The retainer 2 includes a base 6, a first support member 10 spatially separated from a second support member 14, and an arm 18 attached to a top edge 20 of the second support member 14. Positional terms, such as top, bottom, above, below, front, and back, are used herein to facilitate the description of the invention, and are not intended to limit the retainer 2 to any particular orientation when used in an electronics system. The retainer 2 can be integrally made of plastic. In one embodiment, the length of the retainer 2 from the one end of the arm 18 to the first support member 10 is approximately 57 mm (FIG. 1E).

The first and second support members 10, 14 extend substantially perpendicular from the base 6. In one embodiment, the first support member 10 includes a barrel-shaped portion 22 and a latch portion 26. A front-facing terrace 30 is cut into the barrel-shaped portion 22. The front of the retainer 2 is denoted by an arrow 32. The terrace 30 supports an edge portion of a circuit board, as illustrated in more detail in FIG. 3. Encircling less than the full circumference of the barrel-shaped portion 22 (here, approximately 300 degrees), a sidewall 34 formed by the terrace 30 prevents the circuit board from rotating when set on the terrace 30.

Located above the terrace 30, the latch portion 26 includes a ledge 36, a post 38 extending perpendicularly from the ledge 36, and notches 40', 40" (generally, notch 40) in opposite sides of the post 38. Each notch 40 has a thickness greater than a thickness of the arm 18 (for latching the arm 18 to the post 38 within the notches 40). At its top, the post 38 has beveled surfaces 42', 42" (generally, 42) on opposite sides. In one embodiment, the height of the first support member 10 from the base 6 to the top of the post 38 is approximately 18 mm (FIG. 1F).

The second support member 14 is a generally rectangular sidewall with a thickness that tapers at the top edge 20. One end of the arm 18 is pivotally attached to the second support member 14 for rotational movement about an axis defined by the top edge 20. In one embodiment, the top edge 20 is a living hinge. As shown in FIG. 1F, the distance of the edge 20 from the base 6 is approximately the same as the distance of each notch 40 from the base 6. The other free end of the arm 18 has a curved finger tab 46 angling away from the arm 18. Preferably, the arm 18 is slightly bowed. The bowing of the arm 18 defines a concave inner surface 45. In other embodiments, the arm 18 can be planar without departing from the principles of the invention. When unlatched (i.e., not in the closed position), the arm 18 tends to return to an open position, such as shown in FIG. 1A.

Extending lengthwise in the arm 18 is a slotted opening 44. The slotted opening 44 includes a circular region 48 and slot regions 52', 52" on opposite sides of the circular region 48. The circular region 48 is sized to receive the post 38 of the first support member 10 when the arm 18 is being rotated into the closed position. The beveled surfaces 42 operate to center the post 38 within the circular region 48 when latching the arm 18 to the post 38.

When in the closed position, the tendency of the arm 18 is to return to an unstressed state, i.e., an open position. Consequently, when the post 38 is inserted far enough through the circular region 48, so that the notches 40 align with the edges of the slot region 52", this tendency causes the post 38 to slide fully or partially into the slot region 52" (as shown in FIG. 1D). The width of each slot region 52', 52" is narrower than the non-notched top portion of the post 38; therefore the post 38 cannot withdraw from the opening 44 in the arm 18 when located in the slot region 52". The arm 18 is thus latched to the latch portion 26 of the post 38.

At the free end of the arm 18, where the finger tab 46 angles away from the bowed arm section, a ridge 50 (herein also called a projection) extends outwardly from the inner surface 45 of the arm 18. In the embodiment shown, the ridge 50 extends the full width of the arm 18. Other embodiments use differently shaped projections or multiple projections of the same or of different sizes. When the arm 18 is rotated and latched into the closed position, the projection 50 extends below the level of the notches 40 on the post 38 and thus comes into contact with the surface of a circuit board placed on the terrace 30 of the first support member 10. The length and width of the arm 18 can vary depending upon the particular location on the surface of a circuit board where pressure is to be applied by the projection 50.

Extending perpendicularly from a bottom surface of the base 6 is a snap 54. The snap 54 includes a pair of spatially separated hooks 58', 58" (generally 58) with sloped faces (FIG. 1C). From the base 6 of the retainer 2 to the tip of the snap 54, one embodiment measures approximately 5.3 mm (FIG. 1F). The snap 54 is used for securing the base 6 of the retainer 2 to a circuit board (e.g., a processor board). The hooks 58 can be squeezed together so that the snap 54 can penetrate an opening in the circuit board. After passing completely through the opening, the hooks 58 return to their separated positions and catch the underside of the circuit board. Other mechanisms can be used to anchor the retainer 2 to a circuit board to practice the principles of the invention, such as adhesives and screws. The retainer 2 can be detached from the circuit board by reversing the process.

Figure 2:
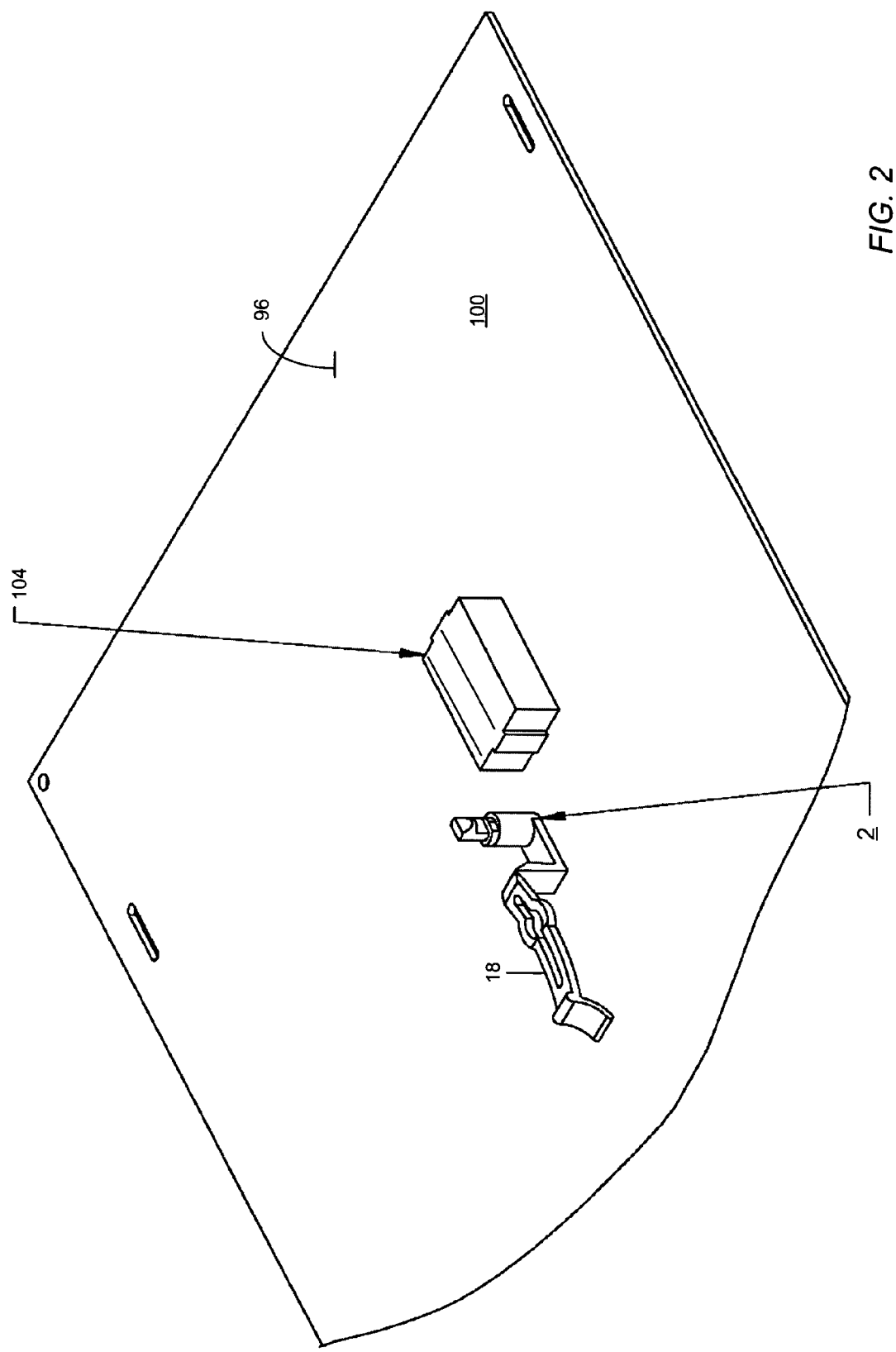
FIG. 2 is an isometric view of the circuit board retainer attached to a first circuit board.

FIG. 2 shows the retainer 2 of the invention attached to the surface 96 of a circuit board 100, such as a processor board, for example, in a manner as previously described. The retainer 2 is shown in the open position. The circuit board 100 has an electrical connector 104 mounted on the surface 96. Preferably, the location of the retainer 2 is near the electrical connector 104 so that the free end of the arm 18 can extend over the electrical connector 104 when rotated into the closed position.

Figure 3:
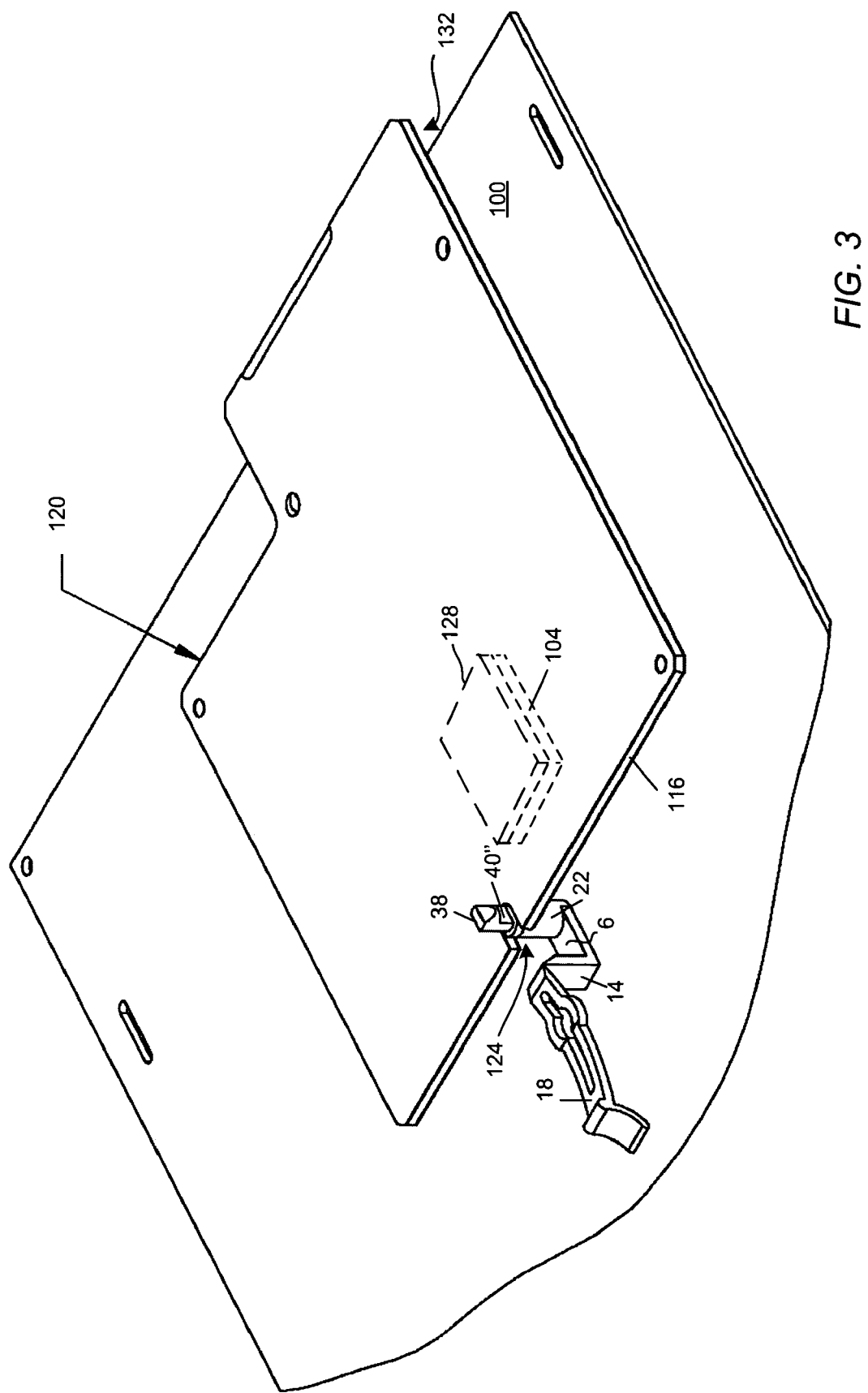
FIG. 3 is an isometric view of the circuit board retainer attached to the first circuit board and supporting an edge portion of a second circuit board.

FIG. 3 shows the retainer 2 of the invention attached at the base 6 to the circuit board 100 of FIG. 2 (hereafter, referred to as a first circuit board) and supporting a second circuit board 120. The circuit boards 100, 120 are substantially parallel to each other. An edge 116 of the second circuit board 120 rests on the terrace 30 (FIG. 1A) of the retainer 2. The terrace 30 determines the height of the second circuit board 120 relative to the first circuit board 100. The edge 116 of the second circuit board 120 has a notch 124 formed therein. The notch 124 is shaped and sized to hug the sidewall 34 on opposite sides of the barrel 22.

The second circuit board 120 has on a lower surface 132. An electrical connector 128 (shown in phantom) is attached to the lower surface and mated to the electrical connector 104 of the first circuit board 100. A technician can lower or laterally slide the circuit board 120 onto the terrace 30 before the electrical connectors 104, 128 are joined. When the edge 116 of the second circuit board 120 abuts the crook in the notch 124, the post 38 and notches 40 project above the plane of the second circuit board 120 and the electrical connectors 104, 128 are aligned for connection. Again, the arm 18 of the retainer 2 is shown in an open position.

Figure 4:
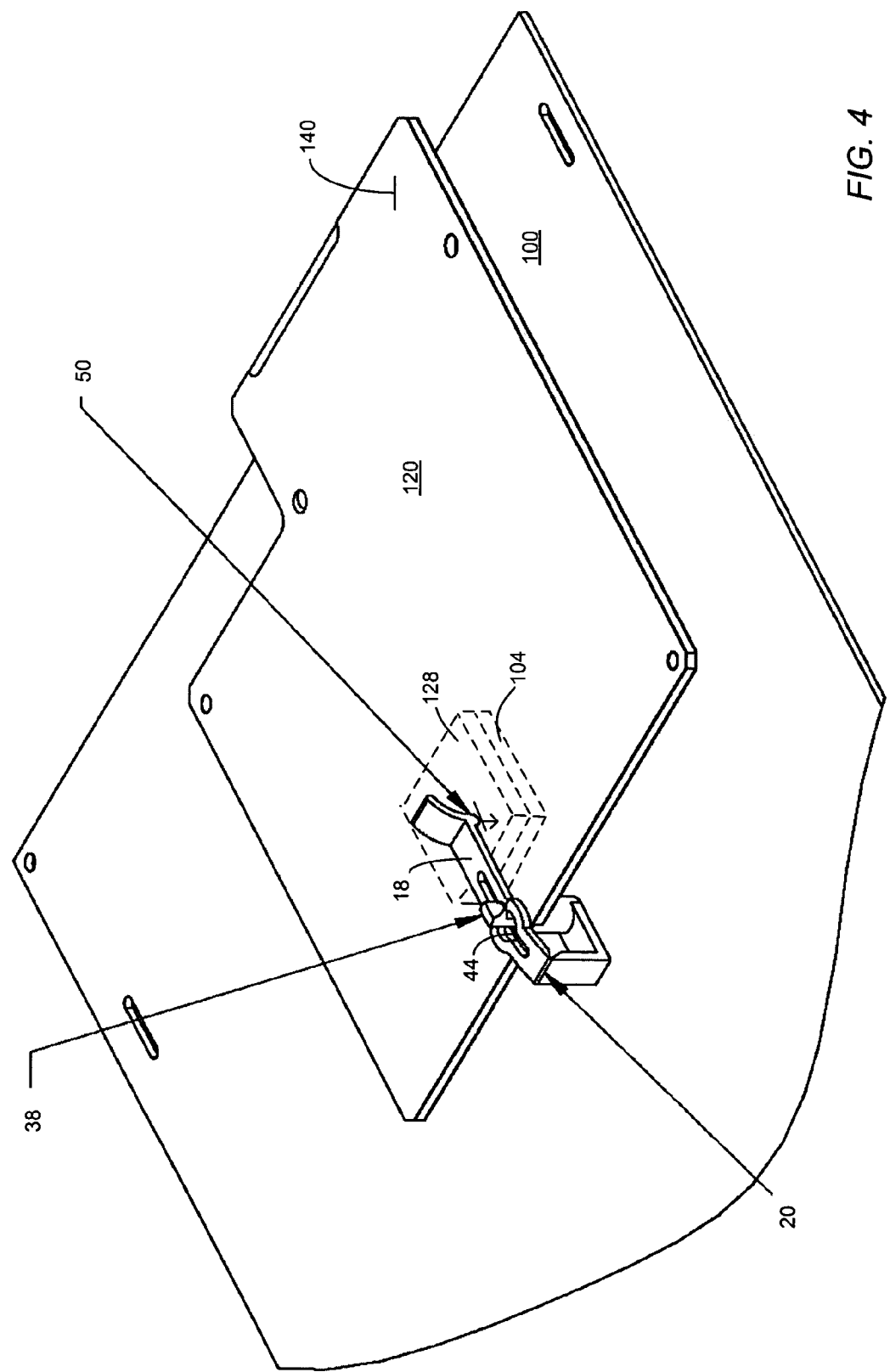
FIG. 4 is an isometric view of the circuit board retainer in the closed position, with an arm of the circuit board retainer pressing against a top surface of the second circuit board.

FIG. 4 shows the circuit board and retainer 2 arrangement of FIG. 3 after the arm 18 of the retainer 2 is rotated and latched into the closed position. In the closed position, the arm 18 extends beyond the first support member 10 over the second circuit board 120. The projection 50 at the free end of the arm 18 makes contact with a top surface 140 of the second circuit board 120. The edges of the slotted opening 44 enter the notches 40 of the post 38, and the arm 18 is thus latched to the post 38. The height of the second circuit board 120 on the post 38, the thickness of the second circuit board 120, the degree to which the projection 50 extends below the level of the notches 40 on the post 38 are some factors that cause the projection 50 to exert a downward force against the top surface 140 of the second circuit board 120. The bowed shape of the arm 18 facilitates latching to the post 38 by providing flexibility after the projection 50 contacts the top surface 40 and the second circuit board 120 begins resisting the arm 18 from depressing further. After the arm 18 is latched, the bowed shape then contributes to the force applied by the projection 50. The force urges the second circuit board 120 toward the first circuit board 100. Preferably, the projection 50 presses against the top surface 140 at a location opposite the mated electrical connectors 104, 128. The constant force operates to keep the electrical connectors 104, 128 in the mated position.

To unlatch the retainer 2, a technician presses the rear side of the second support member 14, near the edge 20, in a direction of the first support member 10. This moves the arm 18 such that the post 38 slides towards the circular region 48 in the opening 44. The technician can then remove the arm 18 by pulling back on the finger tab 46.

While the invention has been shown and described with reference to specific preferred embodiments, it should be understood by those skilled in the art that various changes in form and detail may be made therein without departing from the spirit and scope of the invention as defined by the following claims. For example, the dimensions of the retainer can vary depending upon the particular application, such as data storage systems, portable devices, for which the retainer is used. Also, although only one retainer is described herein, multiple retainers at various locations can be used to urge adjacent circuit boards together. Moreover, retainer arms can be constructed to apply pressure concurrently at multiple locations on the surface of the second circuit board.

What is claimed is:

1. A circuit board retainer, comprising:
   a base for attaching to a first circuit board;
   opposing spatially separated first and second support members extending from one side of the base, the first support member having a latch portion and a terrace adjacent to the latch portion for supporting a portion of a second circuit board thereon; and
   an arm having a free first end with a projection extending from a surface thereof and a second end pivotally attached to an edge of the second support member for rotational movement between an open position and a closed position, a section of the arm between the first free end and the second end latching onto the latch portion of the first support member when the arm is rotated into the closed position, the free first end of the arm extending beyond the first support member for pressing the projection against a surface of the second circuit board when the section of the arm between the first free end and the second end is latched onto the latch portion of the first support member.

2. The retainer of claim 1, further comprising a snap extending from a second side of the base for snapping into an opening in the first circuit board for securely attaching the base to the first circuit board.

3. The retainer of claim 1, wherein the terrace is shaped to prevent rotational movement of the second circuit board supported thereon.

4. The retainer of claim 1, further comprising a living hinge attaching the arm to the edge of the second support member.

5. The retainer of claim 1, wherein the arm is bow-shaped.

6. The retainer of claim 1, wherein the section of the arm between the first free end and the second end has an opening formed therein for accepting the latch portion of the first support member.

7. The retainer of claim 1, wherein the retainer is integrally constructed of a plastic material.

8. An electronics module, comprising:
   a first circuit board having a surface with an electrical connector attached thereto;
   a second circuit board having a surface with an electrical connector attached thereto and mated to the electrical connector of the first circuit board; and
   a retainer having a base securely attached to the first circuit board, opposing spatially separated first and second support members extending from one side of the base, and an arm having a free first end and a second end pivotally attached to an edge of the second support member for rotational movement between an open position and a closed position, the first support member having a latch portion and a terrace for setting a portion of the second circuit board thereon, an intermediate section of the arm latching onto the latch portion of the first support member when the arm is rotated into the closed position, the free first end of the arm extending beyond the first support member and pressing against an opposite surface of the second circuit board to urge the mated electrical connectors together when the arm is latched to the first support member.

9. The electronics module of claim 8, wherein the free first end has a projection extending from a surface thereof that presses against the opposite surface of the second circuit board when the arm is latched in the closed position.

10. The electronics module of claim 8, wherein the projection presses against a location on the opposite surface of the second circuit board that is directly opposite the electrical connector on the second circuit board.

11. The electronics module of claim 8, further comprising a snap extending from a second side of the base for snapping into an opening in the first circuit board for securely attaching the base to the first circuit board.

12. The electronics module of claim 8, wherein the terrace is shaped to prevent rotational movement of the second circuit board supported thereby.

13. The electronics module of claim 8, further comprising a living hinge attaching the arm to the edge of the second support member.

14. The electronics module of claim 8, wherein the arm is bow-shaped.

15. The electronics module of claim 8, wherein the section of the arm between the first free end and the second end has an opening formed therein for accepting the latch portion of the first support member.

16. The electronics module of claim 8, wherein the retainer is integrally constructed of a plastic material.

17. A circuit board retainer for maintaining an electrical connector on a first circuit board in a mated condition with an electrical connector on a second circuit board, comprising:

means for securing the retainer to the first circuit board, the securing means including a base;

means, connected to the base, for supporting a portion of the second circuit board adjacent and substantially parallel to the first circuit board such that the electrical connectors can make an electrical connection with each other;

means for urging the second circuit board toward the first circuit board to maintain the electrical connection between the electrical connectors; and means for latching the urging means onto the supporting means.

18. The circuit board retainer of claim 17, wherein the urging means contacts one side of the second circuit board at a location that is directly opposite the electrical connector on an opposite side of the second circuit board.

19. The circuit board retainer of claim 17, further comprising means, connected to the base, for supporting the urging means, and means for rotatably connecting the urging means to the means for supporting the urging means.

* * * * *